(12) United States Patent
Barringer et al.

(10) Patent No.: US 6,671,184 B1
(45) Date of Patent: Dec. 30, 2003

(54) LATCHING AND LOCKING HANDLES

(75) Inventors: Dennis R. Barringer, Wallkill, NY (US); John C. Hilburn, Austin, TX (US); Gregory H. Richardson, Sumner, WA (US); Harold M. Toffler, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/194,836

(22) Filed: Jul. 12, 2002

(51) Int. Cl.⁷ .................................................. H05K 7/18
(52) U.S. Cl. ....................... 361/801; 361/759; 361/726; 361/754
(58) Field of Search ............................ 361/801, 759, 361/740, 732, 726, 747, 754

(56) References Cited

U.S. PATENT DOCUMENTS

| | | | |
|---|---|---|---|
| 4,313,150 A | 1/1982 | Chu ............................ 361/399 |
| 4,498,123 A | 2/1985 | Fuss et al. ................... 361/427 |
| 5,011,202 A | 4/1991 | Kato et al. ............... 292/336.3 |
| 5,285,353 A | 2/1994 | Buck et al. .................. 361/732 |
| 5,297,000 A | 3/1994 | Freige et al. ................ 361/692 |
| 5,325,269 A | 6/1994 | Someno ....................... 361/796 |
| 5,428,535 A | 6/1995 | Katsumata et al. ..... 364/424.05 |
| 5,586,003 A | 12/1996 | Schmitt et al. ............. 361/683 |
| 5,724,231 A | 3/1998 | Winick et al. .............. 361/759 |
| 5,774,344 A | 6/1998 | Casebolt ...................... 361/800 |
| 5,794,994 A | 8/1998 | Miyagawa et al. ....... 292/336.3 |
| 6,061,244 A | 5/2000 | O'Sullivan et al. ......... 361/727 |
| 6,185,106 B1 * | 2/2001 | Mueller ....................... 361/798 |
| 6,373,713 B1 * | 4/2002 | Jensen et al. ................ 361/759 |

\* cited by examiner

*Primary Examiner*—David Martin
*Assistant Examiner*—Hung Bui
(74) *Attorney, Agent, or Firm*—Floyd A. Gonzalez; Cantor Colburn LLP

(57) ABSTRACT

A handle having a handle body, a latching arm, and a pivot block is provided. The handle body has a release finger and a pivot leg. The latching arm is slideably secured to the handle body. The pivot block is connectable to a device having at least one movable component. The pivot block is also connected to a first portion of the pivot leg so as to allow the handle body to rotate in the pivot block about the first portion between a first position and a second position. The first position is a locked position and the second position is a latched position.

18 Claims, 8 Drawing Sheets

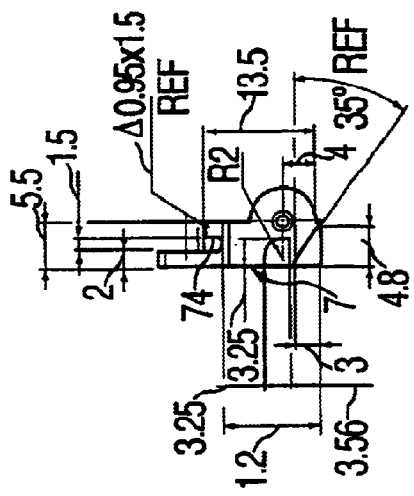
FIG. 8
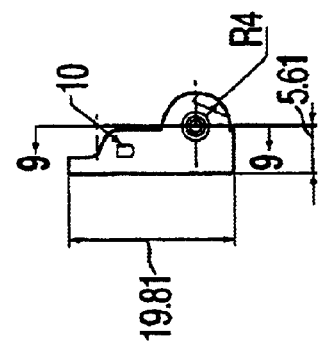
FIG. 11
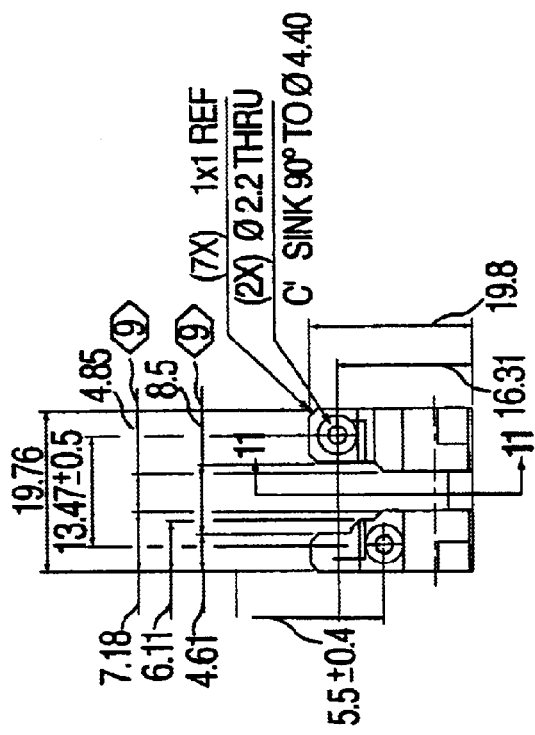
FIG. 7
FIG. 10
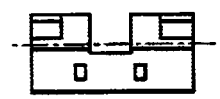
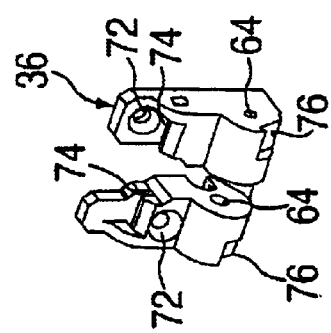
FIG. 6
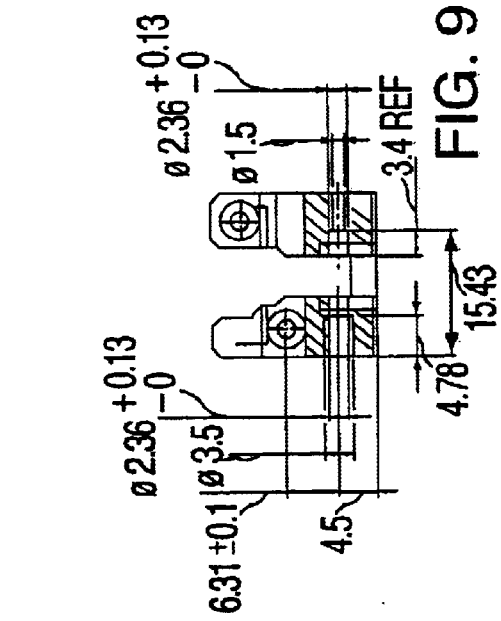
FIG. 9

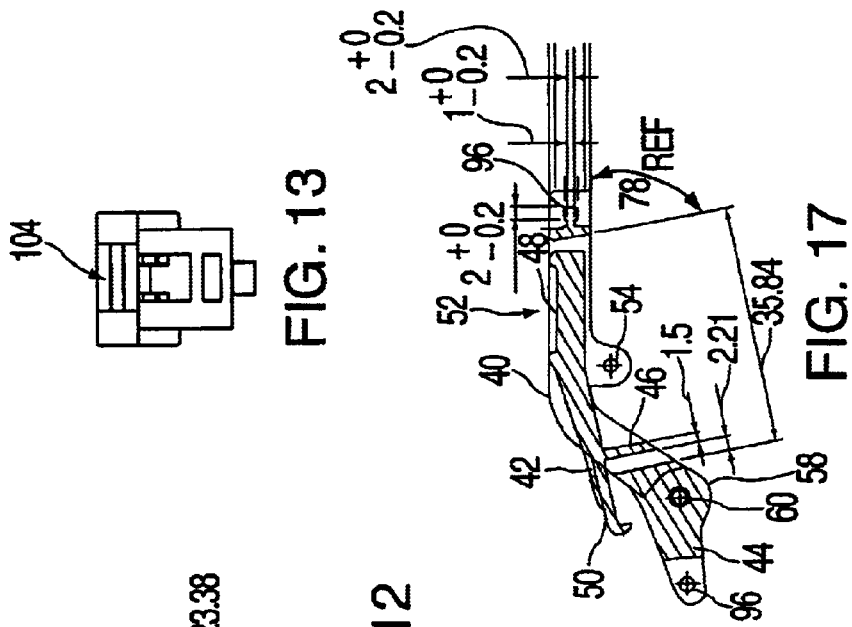
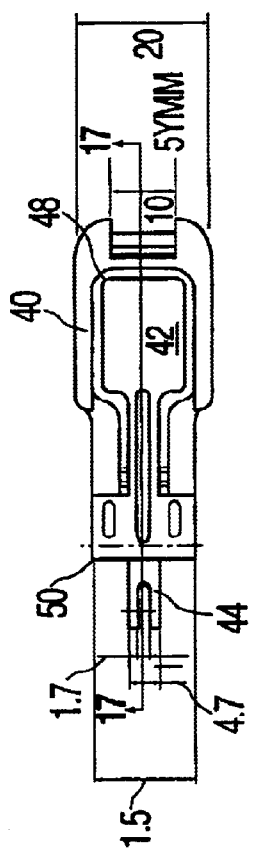
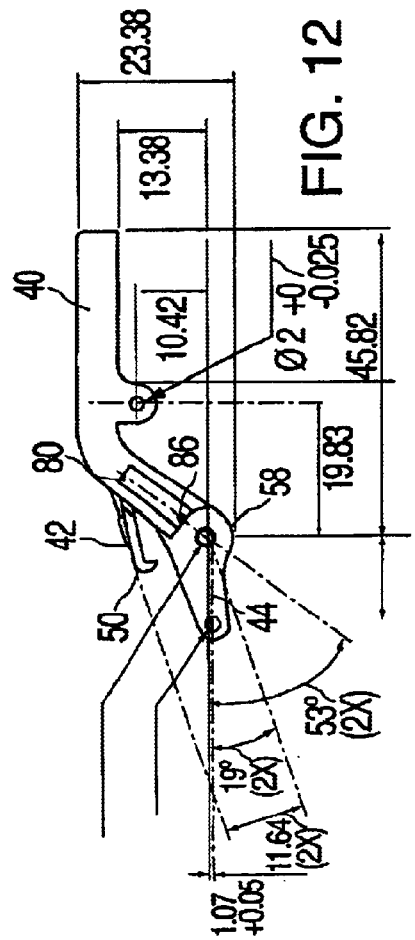
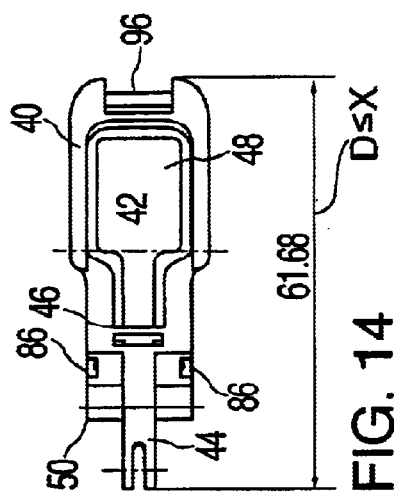
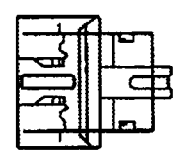

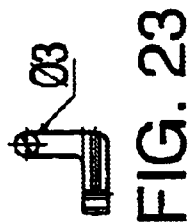
FIG. 23
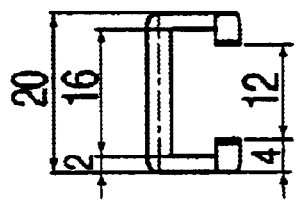
FIG. 20
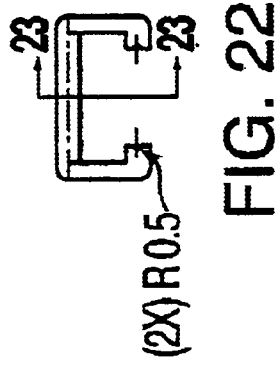
FIG. 22
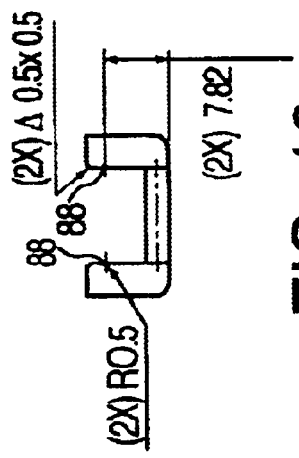
FIG. 19
FIG. 21
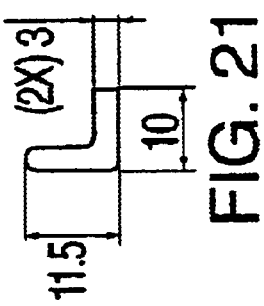
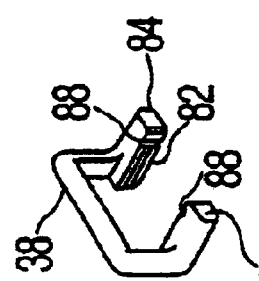
FIG. 18

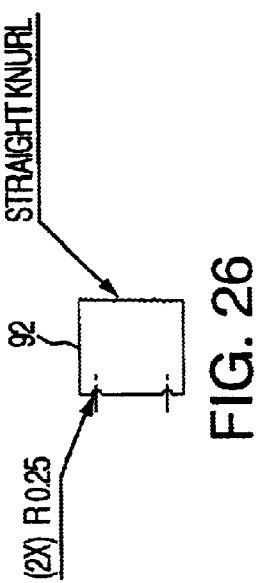
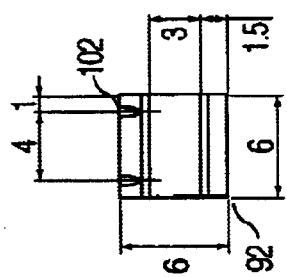
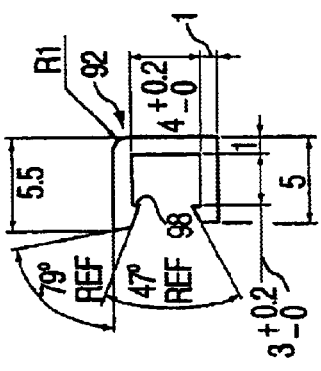
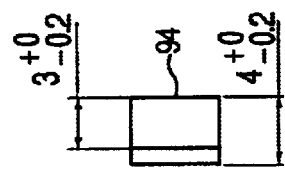
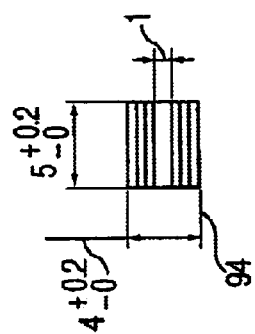
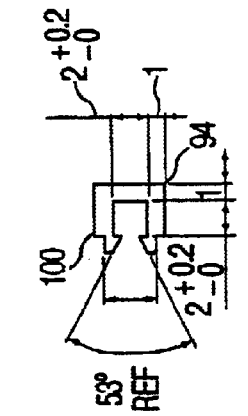

LATCHING AND LOCKING HANDLES

RELATED APPLICATION

This application is related to commonly owned and assigned U.S. patent application Ser. No. 09/941,912 filed on Aug. 29, 2001, entitled "Auto Docking/Locking Rack Hardware For Easy Serviceability of Printed Circuit Cards in Tight Spaces", the contents of which are incorporated herein in their entirety by reference thereto.

BACKGROUND OF THE INVENTION

The present disclosure is directed to latching and locking handles. More particularly, the present disclosure is directed to handles having the ability to latch in an open position and/or to lock in a closed position. Such handles find use in a variety of different applications. For example, such latching and locking handles find particular use in the area of circuit boards.

The past twenty-five or so years have seen the development of ever smaller electrical circuit components. However, to take fullest advantage of achievements in electrical circuit miniaturization, one must package the resultant component in an efficient manner. Clearly, the packaging of circuit components in tight spaces is a direct logical extension of decreasing the size of the components.

Moreover, mainly for reasons associated with long-term system operation and reliability of such components, it is likewise very desirable to be able to easily insert and remove these components even when they are disposed in very tight spaces. Disposing these components in very tight spaces leads to several different design constraints on the system used to secure these components in the selected space. Further, disposing these components in very tight spaces leads to several different design constraints on the cooling of the system components in the selected space.

Accordingly, a continuing need exists for systems to secure closely packaged components in a desired space in a manner that allows the components to be easily inserted, secured in place, and removed when needed. There is also a continuing need for securing systems that mitigate the potentially detrimental cooling effects caused by closely packaging components.

SUMMARY

A latching and locking handle comprising a handle body, a latching arm, and a pivot block is provided. The handle body has a release finger and a pivot leg. The latching arm is slideably secured to the handle body. The pivot block is connectable to a device having at least one movable component. The pivot block is also connected to a first portion of the pivot leg so as to allow the handle body to rotate in the pivot block about the first portion between a first position and a second position. The first position is a locked position and the second position is a latched position.

A pluggable cartridge comprising walls and a printed circuit card moveably housed within and protected by the walls is provided. A pivot block is secured to one of the walls. A handle is movably connected to the pivot block so as to be movable between a first position and a second position. A portion of the handle is also attached to the printed circuit card by an articulated mechanical linkage such that movement of the handle moves the printed circuit card. A latching arm is slideably secured to the handle. The first position defines a locked position having a portion of the handle lockably engaged with the pivot block, and the second position defines a latched position having a portion of the latching arm latchably engaged with the pivot block.

A method of securing and unsecuring a pluggable cartridge in a structure comprises moving a handle to a first position, the handle being connected to a first movable portion of the pluggable cartridge, the first movable portion of the pluggable cartridge being secured in a first desired position when in the first position; sliding the pluggable cartridge into the structure until the first movable portion is in a facial spaced relationship with a portion of the structure; depressing a release arm of the handle to unsecure the first movable portion from the first desired position; and moving the handle to a second position to move the first movable portion to a second desired position, the second desired position being defined by the first movable portion being seated in the portion of the structure, the second position being configured to secure the second movable portion of the pluggable cartridge in the second desired position.

BRIEF DESCRIPTION OF THE DRAWINGS

FIGS. 6–11 illustrate various views of an exemplary embodiment of a pivot block;

FIGS. 12–17 illustrate various views of an exemplary embodiment of a handle body;

FIGS. 18–23 illustrate various views of an exemplary embodiment of a latching arm;

FIGS. 24–26 illustrate various views of an exemplary embodiment of a cover; and

FIGS. 27–29 illustrate various views of an exemplary embodiment of a tab.

DETAILED DESCRIPTION OF THE INVENTION

Figure 1:
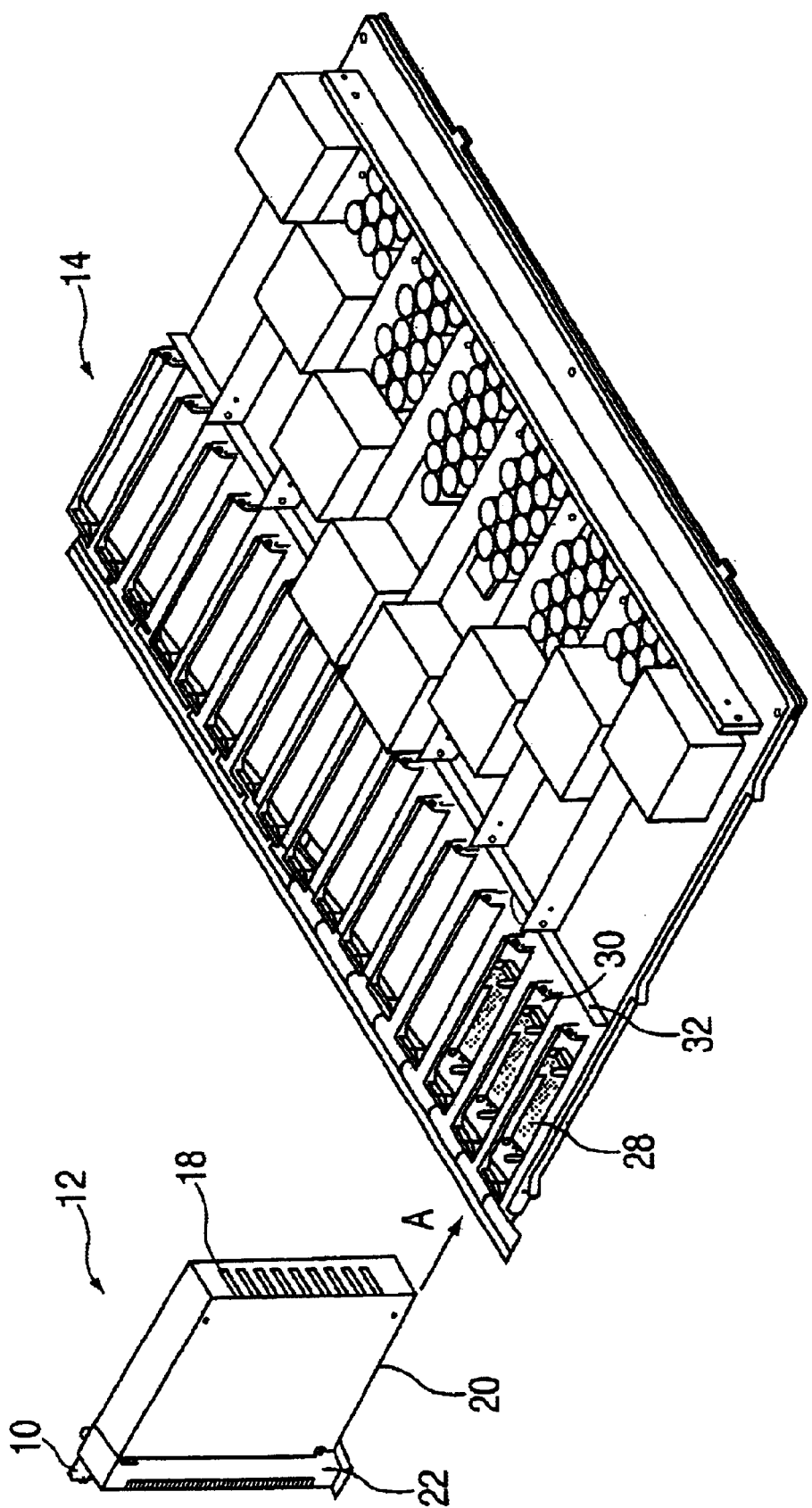
FIG. 1 is a rear isometric view illustrating a component cartridge during installation.
Figure 2:
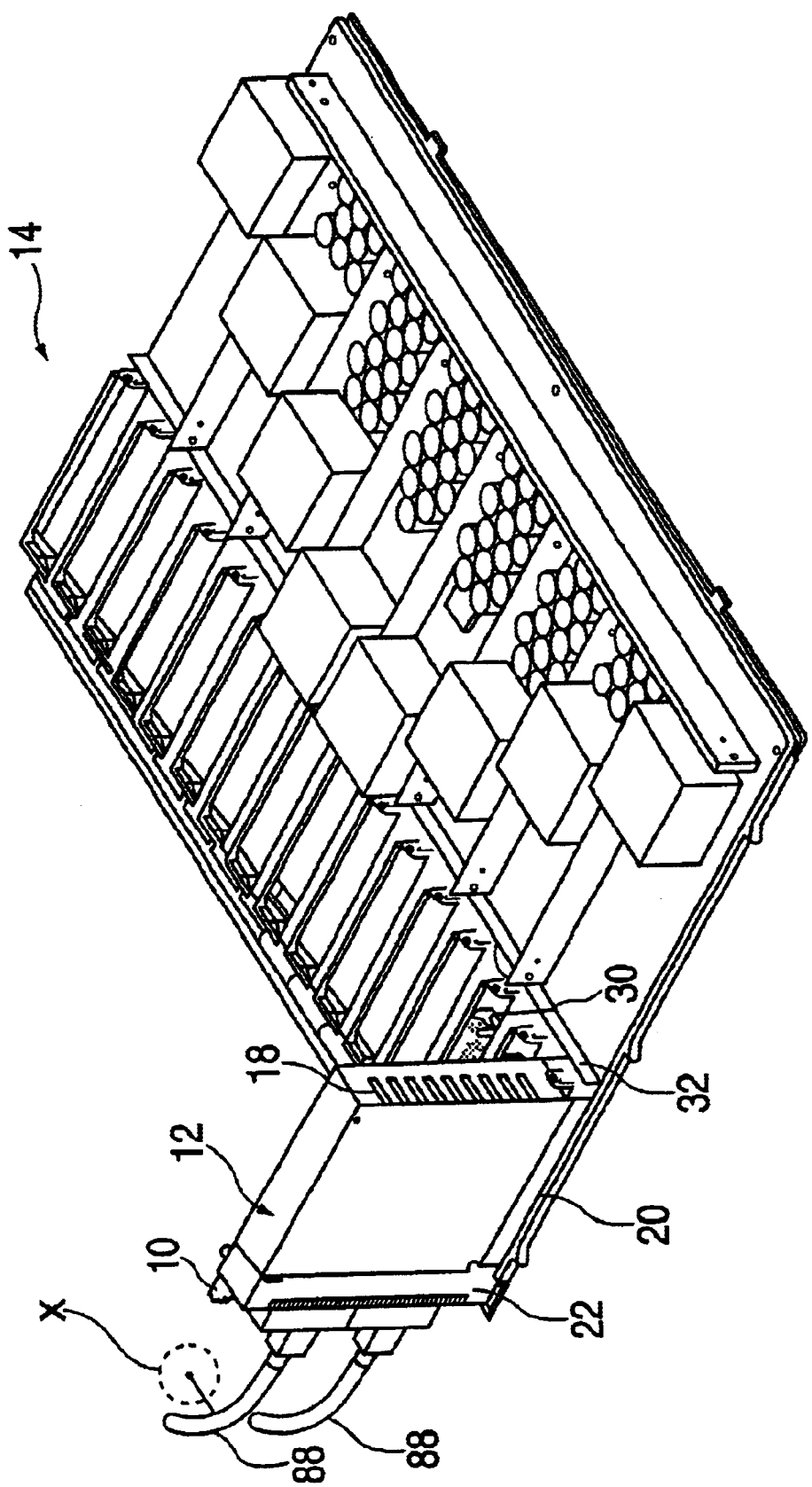
FIG. 2 is view of FIG. 1 illustrating the component cartridge after installation.
Figure 3:
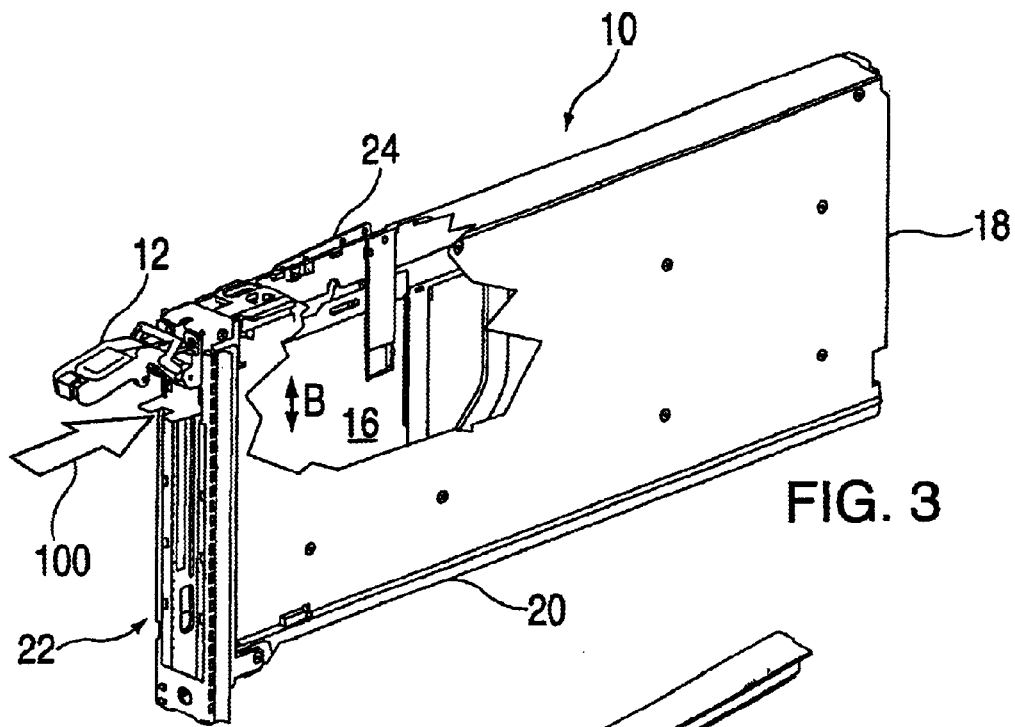
FIG. 3 is a front isometric view of the component cartridge of FIG. 1.

The present disclosure is directed to an exemplary embodiment of a handle. The handle is moveable between a first position and a second position. The handle provides a securing feature in each of the positions. Namely, the handle can be locked into place when it is in the first position and can be latched into place when it is in the second position. The handle is prevented from being moved when it is either locked in the first position or latched in the second position. An integral release finger is configured to unlock and unlatch the handle with a simple pressing movement on the release finger. Thus, the handle can easily be moved between the first and second positions, the locked/unlocked state, and the latched/unlatched state with one hand.

Referring now to FIGS. 1–4, an exemplary embodiment of a handle 10 is illustrated with reference to a pluggable cartridge 12 and a guide structure 14. The cartridge 12 is shown before insertion into the structure 14 in FIG. 1 and is shown fully inserted into the structure in FIG. 2. In order to install the cartridge 12, the cartridge is slid into the guide structure 14 in the direction of arrow A. The handle 10 is then moved to secure/interconnect various components of the cartridge 12 to various components of the structure 14.

It should be recognized that the handle 10 is illustrated herein by way of example only as finding use with the cartridge and structure. Of course, the handle can be used in a variety of different applications and locations without departing from the essential scope thereof.

The cartridge 12 comprises a printed circuit card 16 (see FIG. 3), a front wall 18, a bottom edge 20, and a back wall 22. The printed circuit card 16 is housed within and protected by the walls of the cartridge 12. Additionally, the card 16 is mounted within the cartridge 12 so as to be moveable in the direction indicated by arrow B. For example, the card 16 can be mounted within the cartridge 12 to move up/down within the cartridge.

An articulated mechanical linkage 24 connects the handle 10 and the card 16 to one another. The handle 10 is configured to move between a first or up position (see FIG. 3) and a second or down position (not shown). When the handle 10 is moved up to the first position, the card 16 is moved down to a position proximate the bottom edge 20. Conversely, when the handle 10 is moved down to the second position, the card 16 is moved up to a position that is remote from the bottom edge 20.

The card 16 comprises a plurality of electrical connectors 26 along its edge proximate to the bottom edge 20 of the cartridge 12. The connectors 26 are accessible (e.g., extend from the cartridge) when the card has been moved down to a position proximate the bottom edge 20. Conversely, the connectors 26 are inaccessible (e.g., retracted into the cartridge) when the card has been moved up to a position remote from the bottom edge 20. Accordingly, the movement of the handle 10 causes the card 16 to move within the cartridge 12 to extend and retract the connectors 26.

The guide structure 14 supports one or more printed circuit boards 28. Each printed circuit board 28 contains a plurality of electrical connectors 30. The connectors 30 of the printed circuit board 28 are configured to mate with the connectors 26 of the printed circuit card 16. In an exemplary embodiment, the connectors 30 are female connectors and the connectors 26 are male connectors. Of course, it is contemplated for the connectors 30 to be male connectors and the connectors 26 to be female connectors, or combinations thereof. In this manner, the connectors 26 and 30 are configured to place the card 16 and the board 28 in electrical communication with one another when the card is plugged or seated in the board.

During the installation of the cartridge 12, the handle 10 is in the down position such that the connectors 26 are retracted within the cartridge. The cartridge 12 is slid into position in the structure 14 until the front wall 18 of the cartridge abuts a stop portion 32 of the structure (see FIG. 2). At this point, the connectors 26 of the card 16 are in a faced spaced relationship with the connectors 30 of the board 28. The card 16 is plugged or seated into the board 28 by moving the handle 10 to the up position. This drives the card 16 downward within the cartridge 12 so that the connectors 26 and 30 mate with one another.

This process is reversed during the removal of the cartridge 12. Namely, the handle 10 is moved to the down position such that the connectors 26 retract into the cartridge. In this position, the connectors 26 are unseated from the connectors 30 of the board 28. The cartridge 12 is slid from the structure 14 until the front wall 18 of the cartridge is free from the structure.

The force necessary to seat and unseat the connectors 26 in the connectors 30 has also been increased by the increased number of electrical circuits disposed on the card 16 and board 28. It is not uncommon for the seating force to exceed about 30 pounds. In prior systems, it was necessary to have access to the top wall of the cartridge 12 in order to apply this seating force. Advantageously, the handle 10 is configured to provide a mechanical advantage or leverage to assist in seating and unseating the card 16 and the board 28 without having access to the top of the card.

In an exemplary embodiment, the handle 10 provides a mechanical advantage of about 3 to 1. In addition, the handle 10 in combination with the mechanical linkage 24 provides an overall mechanical advantage of about 4.8 to 1. Thus, only about 6.25 pounds of force need be applied to the handle 10 in order to seat and unseat the card 16 from the board 28. Of course, it is contemplated for the handle 10 and/or the mechanical linkage 24 to provide a higher or lower mechanical advantage. For example, the handle 10 can be made longer and/or the linkage's leverage can be increased or decreased as needed. Of course, it should be recognized that the articulated mechanical linkage 24 illustrates an exemplary mechanism for imparting motion to printed circuit card 16. However, any convenient arrangement of pivoted levers may be employed provided that the movement of the handle 10 causes the card 16 to move in the desired directions.

The cartridge 12 can be assembled in the structure 14 prior to shipping of this assembly. Advantageously, the handle 10 locks the printed circuit card 16 in the plugged position in the printed circuit board 28. Thus, the handle 10 can mitigate the unplugging of the printed circuit card 16 from the printed circuit board 28 that can occur due to shocks and vibrations that can occur during shipping (e.g., ship shock).

The cartridge 12 can be removed from the structure 14, such as can occur when servicing the assembly. Damage to the printed circuit card 16 and/or the printed circuit board 28 can occur if the cartridge is removed from the structure while the connectors 26 are seated in the connectors 30. Accordingly, it is typically desired for the connectors 26 to remain retracted, and thus unseated from the connectors 30 of the board 28. This ensures that the connectors 26 and 30 are not in electrical communication with one another or cannot make intermittent electrical communication with one another during removal of the cartridge 12 from the structure 14. Advantageously, the handle 10 is also configured to latch the printed circuit card 16 in the unplugged position. Thus, the handle 10 can mitigate the electrical contact between the connectors 26 and 30 during the removal of the cartridge 12 from the structure 14.

Figure 4:
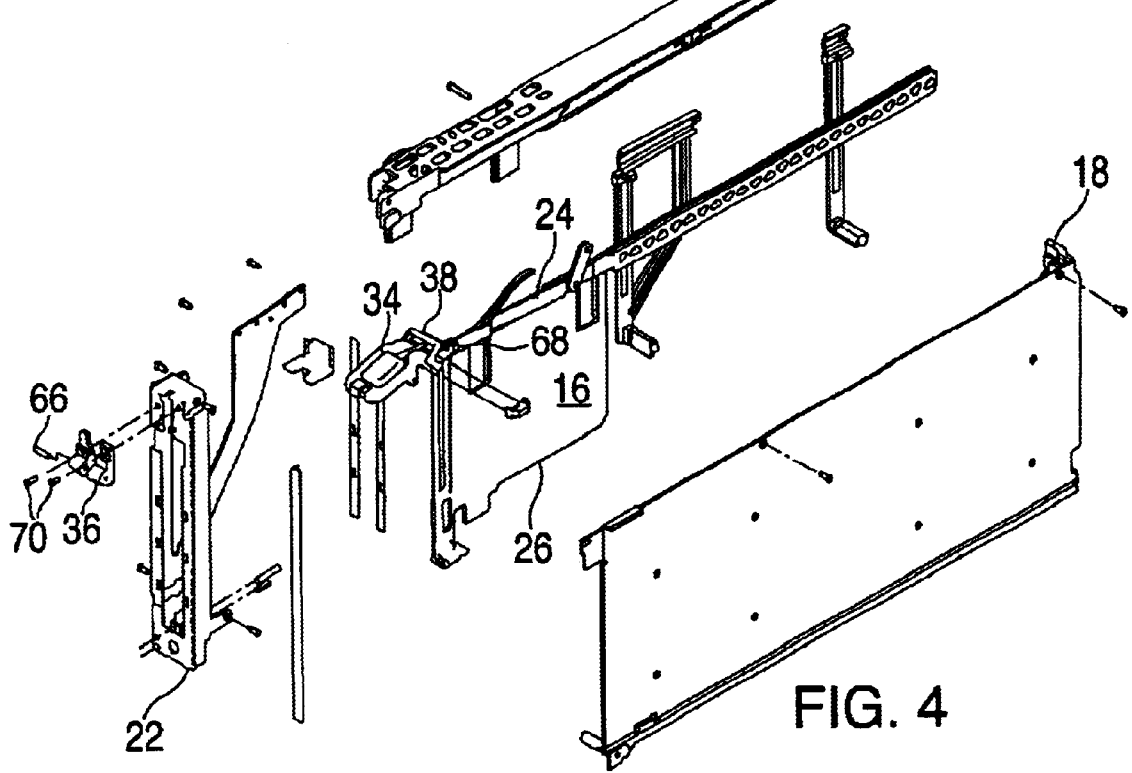
FIG. 4 is an exploded view of FIG. 3.
Figure 5:
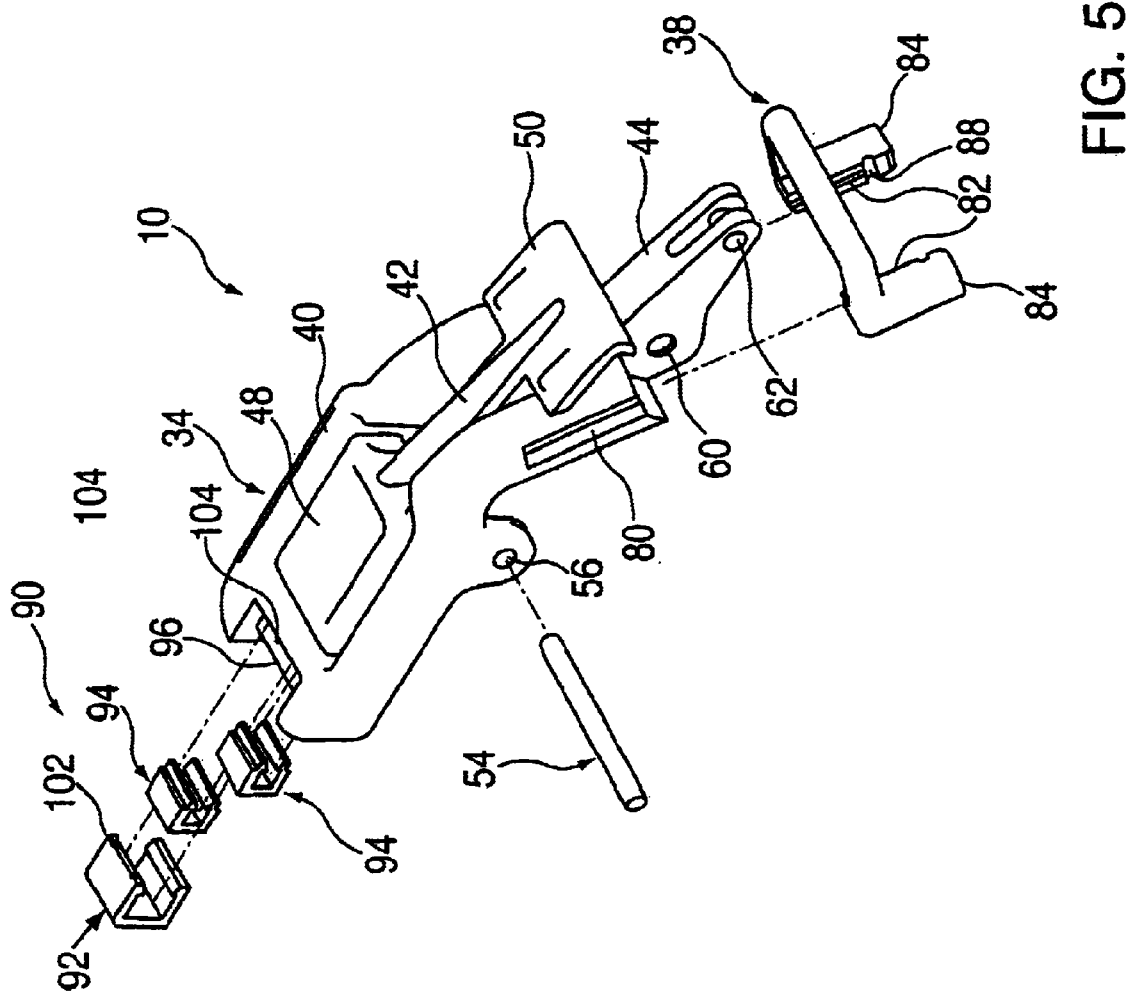
FIG. 5 is an exploded view of an exemplary embodiment of a locking and latching handle.

Referring now to FIGS. 4–5, the handle 10 comprises a handle body 34, a pivot block 36, and a latching arm 38. An exemplary embodiment of the pivot block 36 is illustrated in FIGS. 6–11. An exemplary embodiment of the handle body 34 is illustrated in FIGS. 12–17. An exemplary embodiment of the latching arm 38 is illustrated in FIGS. 18–23. The operation of the handle 10 is therefore best understood with the simultaneous reference to these figures.

The handle body 34 (FIGS. 5 and 12–17) comprises a gripping member 40, a release finger 42, and a pivot leg 44. The handle body 34 has a substantially unitary construction and thus can be molded in a single molding operation.

The release finger 42 is disposed within the gripping member 40. More specifically, the release finger 42 depends from the gripping member 40 at a biasing portion 46. The release finger 42 comprises a first end 48 and a second end 50.

The materials of the handle body 34 impart sufficient rigidity to the handle body, but also impart a selected amount of flexibility to the biasing portion 46. Thus, the release finger 42 is configured to be depressed by imparting a release force on the first end 48 in the direction of arrow C (FIG. 17). The release force causes the biasing portion 46 to elastically flex to allow the first end 48 to move in the direction of the force, which causes the second end 50 to move in a direction opposite the force. Namely, the biasing portion 46 acts as a fulcrum to allow the force on the first end 48 to control the position on the second end 50. Once the force is released, the elasticity of the biasing portion 46 returns the release finger 42 to its normal position.

In a first exemplary embodiment, the handle body 34 is formed of a polycarbonate material. For example, the handle body 34 can be formed of a polycarbonate material having a glass fiber reinforcing dispersed therein. In an exemplary embodiment, the handle body 34 is formed of polycarbonate having about 30% glass fiber reinforcing.

The handle body 34 can further comprise a support bar 54 (FIG. 5). The support bar 54 can be positioned below the first end 48 of the release finger 42 or above the second end 50 of the release finger. In this way, the support bar 54 can be used to provide a maximum range of motion of the first end 48. By limiting the range of motion of the first end 48, the support bar 54 can ensure that the biasing portion 46 is not stressed beyond its elastic limit. The support bar 54 is illustrated by way of example only as being inserted into match holes 56 formed in the gripping member 40. However, it is also contemplated for the support bar 54 to be integral with the handle body 34.

The pivot leg 44 extends from the gripping member 40 at a pivot point 58. The leg 44 comprises a first hole 60 and a second hole 62. The first hole 60 is configured for use in securing the handle body 34 to the pivot block 36. For example, the pivot block 36 (FIGS. 6–11) comprises a connection point 64. A connecting member 66, such as a screw or a rod (FIG. 4), can be inserted through the first hole 60 and the connection point 64 to secure the pivot leg 44 and the pivot block to one another. The connection member 66 allows the pivot leg 44 to rotate within the pivot block 36.

The second hole 62 is configured for use in securing the handle body 34 to the mechanical linkage 24. For example, a connecting member 68, such as a screw or a rod (FIG. 4), can be inserted through the second hole 62 and the linkage 24 to secure the pivot leg 44 and the linkage to one another. The connecting member 68 allows the pivot leg 44 and the mechanical linkage 24 to rotate with respect to one another.

The handle body 34 rotates within the pivot block 36 such that the handle 10 moves between the first and second positions. As the handle body 34 rotates within the pivot block 36, the pivot point 58 acts as a fulcrum. Thus, the seating/unseating force that is applied to the handle 10 at the gripping member 40 can be applied with a selected mechanical advantage to the mechanical linkage 24. As discussed above, the handle 10 can have a mechanical advantage of about 3 to 1. Specifically, the pivot point 58 is positioned so as to provide the gripping member 40 with a mechanical advantage with respect to the location of the second hole 62 (e.g., the connection point to the mechanical linkage).

The pivot block 36 is secured to the cartridge 12 by way of, for example screws 70 (FIG. 4), through holes 72 (FIGS. 6–11) defined within the block. The pivot block 36 comprises a locking feature 74 and a latching feature 76. The locking feature 74 coincides with the first position of the handle 10, while the latching feature 76 coincides with the second position of the handle.

The locking feature 74 is configured to lockably receive the second end 50 of the release finger 42. Namely, the second end 50 of the release finger 42 is lockably received in the locking feature 74 when the handle 10 has been rotated to the first position.

The front edge of the locking feature 74 has a slight chamfer 78 defined thereon. As the handle 10 is rotated to the first position, the second end 50 of the release finger 42 abuts the chamfer 78. The interaction of the chamfer 78 on the second end 50 causes the biasing portion 46 to flex to allow the second end to ride up and over the chamfer. Once the handle 10 is in the first position, the biasing portion 46 elastically flexes to allow the second end 50 to lock in the locking feature 74.

In order to release the second end 50 from the locking feature 74, the release force is applied to the first end 48 of the release finger 42 in the direction of arrow C (FIG. 17). As discussed above, the release force causes the biasing portion 46 to elastically flex and causes the second end 50 to move in a direction opposite the force (e.g., upward in the orientation of the handle illustrated in the Figures). By moving the second end 50 upward, the second end is released from the locking feature 74, which allows the handle body 34 to be rotated from the first position.

In this manner, the release finger 42 is configured to lock the handle 10 in place by simply rotating the handle to the first position, and is configured to be unlocked and moved away from the first position by merely depressing the first end 48 while rotating the handle body 34.

As discussed above, the handle 10 also comprises a latching arm 38 (FIGS. 18–23). The latching feature 76 of the pivot block 36 is configured to latchably receive the latching arm 38.

The latching arm 38 is slideably secured to the handle body 34. Specifically, the handle body 34 comprises one or more channels 80 disposed thereon (FIGS. 5 and 12). The latching arm 38 comprises an inner surface 82 (FIGS. 5 and 18). The latching arm 38 is secured to the handle body 34 such that the inner surface 82 rides in the channel 80. The latching arm 38 can slide in the channel 80 between a latched position proximate the pivot block 38 and an unlatched position remote from the pivot block. When the latching arm 38 is in the latched position, the ends 84 of the latching arm 38 rest in the latching feature 76 of the pivot block 36.

The handle body 34 and latching arm 38 can include securing features to maintain the latching arm in either the latched or unlatched position. For example, the channel 80 of the handle body 34 can comprise a protrusion 86 depending therefrom (FIGS. 12 and 14). The inner surface 82 of the latching arm 38 can comprise an indentation 88 defined therein (FIGS. 5 and 18–19). As the latching arm 38 is slid to the latching position, the protrusion 86 flexes the inner surface 80 of the latching arm outward. Once the protrusion 86 rests in the indentation 88, the resiliency of the latching arm 38 returns the arm to its normal position. Thus, the cooperation of the protrusion 86, indentation 88, and resiliency of the latching arm 38 serve to maintain the arm in the latched position.

In order to release the latching arm 38 from the latching feature 76, the protrusion 86 is removed from the indentation 88. Advantageously, the release finger 42 is also configured to slide the latching arm 38 away from the latching position a distance sufficient to cause the protrusion 86 to flex the inner surface 80 of the latching arm outward. Specifically, applying the release force to the first end 48 of the release finger 42 in the direction of arrow C (FIG. 17) causes the biasing portion 46 to elastically flex and causes the second end 50 to move in a direction opposite the force (e.g., upward). By moving the second end 50 upward, a portion of the release finger 42 abuts the latching arm 38. This causes the latching arm 38 to be moved away from the latching position a distance sufficient to cause the protrusion 86 to release from the indentation 88.

In this manner, handle 10 is configured to be latched in the second position by rotating the handle body to the second position and sliding the latching arm 38 into the latching feature 76 of the pivot block 36. The handle 10 can be unlatched by merely depressing the first end 48 of the release finger 42.

Accordingly, the release finger 42 unsecures both locking and latching features by simply depressing the first end 48 of the release finger. The handle 10 is locked in the first position by simply moving the handle body 34 to the first position. The handle 10 is latched in the second position by simply moving the handle body 34 to the second position and sliding the latching arm 38 into the latching feature 76. Thus, the handle 10 can easily be moved between the first and second positions, the locked/unlocked states, and the latched/unlatched states with one hand.

It is also contemplated for the handle body 34 and or the latching arm 38 to include means for biasing the latching arm toward the pivot block 36. In this manner, the handle 10 is latched in the second position by simply moving the handle body 34 to the second position. Once in the second position, the biasing means can cause the latching arm 38 to be slid into the latching feature 76. For example, the biasing means can include a spring, one or more flexible features of the handle, and others.

By latching the handle 10 in the second position, the handle provides a gripping location for sliding the cartridge 12 into and out of the structure 14. Namely, the cartridge 12 can be slid into the structure 14 by pushing on the handle 10 until the front wall 18 of the cartridge abuts a stop portion 32 of the structure. Conversely, the cartridge 12 can be slid out of the structure 14 by pulling on the handle 10 until the front wall 18 of the cartridge is free from the structure.

Additionally, the handle 10 provides a positive visual indicator as to the position of the card 16 in the board 28. Namely, the handle 10 locks the card 16 in the seated position and latches the card in the unseated position. The position of the card 16 (e.g., seated or unseated) can be discerned merely by looking at the position of the handle 10.

The handle 10 also allows for the cooling of the electronic components, when in the first or locked position. Typically, the card 16 is cooled by directing a supply of cooling air through the cartridge 12. The cooling air can be directed across the card 16 by forcing air through the cartridge 12 from the front wall 18 to the back wall 22. Alternately, cooling air can be directed across the card 16 by forcing air through the cartridge 12 from the back wall 22 to the front wall 18. Advantageously, the handle 10 is configured to not block the flow of cooling air when the card 16 is operative. Namely, when the handle 10 is in its first position such that the card 16 is seated in the board 28 (e.g., the card is operative), the handle is locked up away from the back wall 22 of the cartridge. Thus, cooling air is allowed to flow through the cartridge 12 unrestricted by the handle 10 to cool the card 16.

The handle 10 also does not take up valuable space in the structure 14, when in the first or locked position. In an exemplary embodiment, the handle 10 extends off the rear wall 22 of the cartridge 12 by about one inch. The rear wall 22 of the cartridge 12 also typically includes data and/or communications cables 88 (two shown) plugged therein. These cables 88 then run from the rear wall 22 of the cartridge 12 to other components within the structure 14. It is common for the cables 88 to have a minimum bend radius of about one inch or more generally indicated as X in FIG. 2. Thus, the distance D the handle 10 extends from the rear wall 22 of the cartridge 12 is well within the minimum bend radius X of the cables 88 (see FIG. 14). Namely, the handle 10 fills the otherwise unusable space between the rear wall 22 of the cartridge 12 and the minimum bend radius X of the cables 88.

Illustrated in FIG. 5, the handle 10 can also be configured to provide a visual indicator 90 of a status of the card 16. For example, some cards 16 may need to be powered down prior to removal from the printed circuit board 28. Alternately it may be desired for the manufacture to indicate that some of the cards 16 should be touched only by a trained factory technician, while other cards may be indicated as being touchable by the user. Thus, there is a desire for the handle 10 to have a visual indicator 90 to communicate a status the card 16.

The visual indicator 90 comprises a cover 92 (FIGS. 5 and 24–26) and one or more tabs 94 (FIGS. 5 and 27–29). In the illustrated embodiment, the visual indicator 90 comprises two tabs 94. The tabs 94 are arranged side by side on a portion of the handle body 34. For example, the handle body 34 can comprise an edge 96 configured to have the tabs 94 secured thereon. In the illustrated embodiment, the tabs 94 are configured to snap fit over a lip formed on the edge 96.

The cover 92 is slideably positioned over the tabs 94. For example, the cover 92 includes a tooth 98 that is configured to snap fit over a lip 100 formed on the rear edge of the tabs 94. The tooth 98 prevents the cover 92 from being removed from the tabs 92, but allows the cover to slide side to side over the tabs. The cover 92 is substantially the same width as the tabs 92. Thus, the cover 92 can be slid from a first position covering all or substantially all of one of the tabs 94, to a second position covering all or substantially all of other of the tabs.

The tabs 94 are different from one another so as to allow a user to discern them from each other. For example, the tabs 94 can have a different color, can have a different surface texture or pattern, can have different numerical or textual characters, and the like. By sliding the cover 92 from the first position to the second position, only one of the tabs 94 is visible at a time. Thus, the visual indicator 90 is provided by displaying only one of the tabs 94 at a time.

The cover 92 and tabs 94 can also comprise a means for maintaining the cover in a selected position. For example, the rear edge of the cover 92 can also comprise one or more indentations 102 defined therein (FIGS. 5 and 25). The edge 96 of the handle body 34 can comprise one or more protrusions 104 depending therefrom (FIGS. 5 and 13). As the cover 92 is slid from covering one of the tabs 94 to covering the other of the tabs, the protrusion 104 causes the cover to flex. Once the protrusion 104 rests in the indentation 102, the resiliency of the cover 92 returns the cover to its normal position. Thus, the cooperation of the protrusion 104, indentation 102, and resiliency of the cover 92 serve to releaseably maintain the cover in the selected position.

In a first exemplary embodiment, the handle 10 is formed of a polycarbonate material. Alternately, the handle can be formed of a polycarbonate material having a glass fiber reinforcing dispersed therein. In an exemplary embodiment, the handle body 34 is formed of polycarbonate having about 30% glass fiber reinforcing, while the remaining portions of the handle 10 are formed of polycarbonate having about 10% glass fiber reinforcing. It should be recognized that the handle can be formed of any material suitable for the environment and stress imposed thereon during use.

It should also be noted that the terms "first", "second", and "third", and the like may be used herein to modify elements performing similar and/or analogous functions. These modifiers do not imply a spatial, sequential, or hierarchical order to the modified elements unless specifically stated.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A latching and locking handle, comprising:
   a handle body having a release finger and a pivot leg, said release finger defining a first end and said pivot leg defining a second end;
   a latching arm slideably secured to said handle body; and
   a pivot block operably fixed to a device having at least one movable component relative thereto, said at least one movable component movable via said handle body, said pivot block being connected to a first portion of said pivot leg so as to allow said handle body to rotate about a pivot defined by said pivot block via said first portion between a first position and a second position, said first position defining a locked position having said second end of said release finger configured to prevent rotation of said handle body when said release finger is lockably engaged with a complementary configured lock feature on said pivot block, and said second position defining a latched position having said latching arm being slid radially toward said pivot of said pivot block such that a portion of said latching arm is latchably engaged with said pivot block thereby preventing rotation of said handle body.

2. The handle as in claim 1, wherein said pivot block comprises a locking feature coinciding with said first position such that said locking feature lockably engages said second end of said release finger when said handle body is in said first position.

3. The handle as in claim 2, wherein said pivot block comprises a latching feature coinciding with said second position such that said latched position is defined by said latching feature latchably engaging said portion of said latching arm when said latching arm is slid toward said pivot block.

4. The handle as in claim 3, further comprising means for biasing said latching arm toward said pivot block, said biasing means being configured to slide said latching arm into latchable engagement with said latching feature when said handle body is in said second position.

5. The handle as in claim 3, further comprising a biasing portion joining said release finger and said handle body such that a force applied to said first end flexes said biasing portion to move a portion of said release finger a distance sufficient to cause said second end to unlock from said locking feature and to cause said latching arm to slide away from said pivot block to unlatch said portion of said latching arm from said latching feature.

6. The handle as in claim 5, wherein a front edge of said locking feature comprises a chamfer, said chamfer being configured to act on said second end as said handle body is rotated to said first position so as to cause said biasing portion to flex to allow said second end to ride up and over said chamfer and into said locking feature when said handle body is in said first position.

7. The handle as in claim 5, wherein said handle body further comprises:
   a support bar configured and positioned to limit a range of motion of said release finger to ensure that said biasing portion is not stressed beyond its elastic limit.

8. The handle as in claim 7, wherein said support bar is positioned below said first end or above said second end.

9. The handle as in claim 1, further comprising an articulated mechanical linkage connecting a second portion of said pivot leg to said movable component such that rotation of said handle body between said first position and said second position cause said movable component to move in a selected manner.

10. The handle as in claim 9, wherein said pivot leg applies a selected leverage to said articulated mechanical linkage.

11. The handle as in claim 1, wherein said handle body has a substantially unitary construction molded in a single molding operation.

12. The handle as in claim 11, wherein said handle body is formed of a polycarbonate material having a glass fiber reinforcing dispersed therein.

13. The handle as in claim 5, wherein said handle body comprises one or more channels disposed thereon and said latching arm comprises an inner surface, said latching arm being slideably secured to said handle body such that said inner surface rides in said one or more channels.

14. The handle as in claim 13, further comprising securing features formed on said inner surface and said channels, said securing features being configured to maintain said latching arm in said latched position and being configured to release said latching arm from said latched position until said force is applied to said first end.

15. The handle as in claim 1, wherein said device is an electronic component is cooled by directing a supply of cooling air through said device, said handle body being configured to not block said supply of cooling air when said handle body is in said first position.

16. The handle as in claim 15, wherein said handle body has a length that is equal to or less than a minimum bend radius of cables secured to said electronic component proximate said handle.

17. The handle as in claim 1, further comprising a cover and one or more tabs, said tabs being arranged side by side on a portion of said handle body, said cover being is slideably positioned to cover all or substantially all of any one of said one or more tabs, wherein said one or more tabs are different from each other so as to allow a user to discern them from each other.

18. The handle as in claim 17, wherein said cover and said one or more tabs further comprise a means for maintaining said cover in a selected position.

* * * * *